United States Patent [19]

Grube et al.

[11] Patent Number: 5,414,298
[45] Date of Patent: May 9, 1995

[54] SEMICONDUCTOR CHIP ASSEMBLIES AND COMPONENTS WITH PRESSURE CONTACT

[75] Inventors: Gary Grube, Monroe; Igor Khandros, Peekskill; Gaetan Mathieu, Carmel, all of N.Y.

[73] Assignee: Tessera, Inc., Elmsford, N.Y.

[21] Appl. No.: 38,178

[22] Filed: Mar. 26, 1993

[51] Int. Cl.[6] ............................................. H01L 39/02
[52] U.S. Cl. .................................. 257/690; 257/602; 257/701
[58] Field of Search ............... 257/698, 717, 720, 747, 257/777, 718, 719, 726, 727, 690, 692, 701

[56] References Cited

U.S. PATENT DOCUMENTS

| | | |
|---|---|---|
| 4,074,342 | 2/1978 | Honn et al. .................... 257/747 |
| 4,597,617 | 7/1986 | Enochs . |
| 4,628,406 | 12/1986 | Smith et al. . |
| 4,695,870 | 9/1987 | Patraw . |
| 4,716,049 | 12/1987 | Patraw . |
| 4,783,719 | 11/1988 | Jamison et al. . |
| 4,811,082 | 3/1989 | Jacobs et al. .................... 257/700 |
| 4,893,172 | 1/1990 | Matsumoto et al. ............. 257/668 |
| 4,902,606 | 2/1990 | Patraw . |
| 4,924,353 | 5/1990 | Patraw . |
| 4,926,241 | 5/1990 | Carey ................................ 257/698 |
| 4,954,878 | 9/1990 | Fox et al. ........................... 357/81 |
| 5,047,830 | 9/1991 | Grabbe . |
| 5,053,922 | 10/1991 | Matta et al. . |
| 5,086,337 | 2/1992 | Noro et al. . |
| 5,123,850 | 6/1992 | Elder et al. . |
| 5,131,852 | 7/1992 | Grabbe et al. . |
| 5,148,265 | 9/1992 | Khandros et al. . |
| 5,148,266 | 9/1992 | Khandros et al. . |
| 5,152,695 | 10/1992 | Grabbe et al. . |
| 5,173,055 | 12/1992 | Grabbe . |

FOREIGN PATENT DOCUMENTS 9205582  4/1992  WIPO .

Primary Examiner—Andrew J. James
Assistant Examiner—S. V. Clark
Attorney, Agent, or Firm—Lerner, David, Littenberg, Krumholz & Mentlik

[57] ABSTRACT

A semiconduct chip assembly includes a chip, terminals permanently electrically connected to the chip by flexible leads and a resilient element or elements for biasing the terminals away from the chip. The chip is permanently engaged with a substrate having contact pads so that the terminals are disposed between the chip and the substrate and the terminals engage the contact pads under the influence of the force applied by the resilient element. The terminals typically are provided on a flexible sheet-like dielectric interposer and the resilient element is disposed between the interposer and the chip. The assembly of the chip and the terminals can be tested prior to engagement with the substrate. Because engagement of this assembly with the substrate does not involve soldering or other complex bonding processes, it is reliable. The assembly can be extremely compact and may occupy an area only slightly larger than the area of the chip itself.

53 Claims, 8 Drawing Sheets

SEMICONDUCTOR CHIP ASSEMBLIES AND COMPONENTS WITH PRESSURE CONTACT

TECHNICAL FIELD

The present invention relates to the art of electronic packaging, and more specifically to assemblies incorporating semiconductor chips and to methods and components useful in making such assemblies.

TECHNICAL FIELD

Modern electronic devices utilize semiconductor chips, commonly referred to as "integrated circuits" which incorporate numerous electronic elements. These chips are mounted on substrates which physically support the chips and electrically interconnect each chip with other elements of the circuit. The substrate may be a part of a discrete chip package used to hold a single chip and equipped with terminals for interconnection to external circuit elements. Such substrates may be secured to an external circuit board or chassis. Alternatively, in a so-called "hybrid circuit" one or more chips are mounted directly to a substrate forming a circuit panel arranged to interconnect the chips and the other circuit elements mounted to the substrate. In either case, the chip must be securely held on the substrate and must be provided with reliable electrical interconnection to the substrate. The interconnection between the chip itself and its supporting substrate is commonly referred to as "first level" assembly or chip interconnection, as distinguished from the interconnection between the substrate and the larger elements of the circuit, commonly referred to as a "second level" interconnection.

The structures utilized to provide the first level connection between the chip and the substrate must accommodate all of the required electrical interconnections to the chip. The number of connections to external circuit elements, commonly referred to as "input-output" or "I/O" connections, is determined by the structure and function of the chip. Advanced chips capable of performing numerous functions may require substantial numbers of I/O connections.

The size of the chip and substrate assembly is a major concern. The size of each such assembly influences the size of the overall electronic device. More compact assemblies, with smaller distances between chips provide smaller signal transmission delays and hence permit faster operation of the device.

First level interconnection structures connecting a chip to a substrate ordinarily are subject to substantial strain caused by thermal cycling as temperatures within the device change during operation. The electrical power dissipated within the chip tends to heat the chip and substrate, so that the temperatures of the chip and substrate rise each time the device is turned on and fall each time the device is turned off. As the chip and the substrate ordinarily are formed from different materials having different coefficients of thermal expansion, the chip and substrate ordinarily expand and contract by different amounts. This causes the electrical contacts on the chip to move relative to the electrical contact pads on the substrate as the temperature of the chip and substrate changes. This relative movement deforms the electrical interconnections between the chip and substrate and places them under mechanical stress. These stresses are applied repeatedly with repeated operation of the device, and can cause breakage of the electrical interconnections. Thermal cycling stresses may occur even where the chip and substrate are formed from like materials having similar coefficients of thermal expansion, because the temperature of the chip may increase more rapidly than the temperature of the substrate when power is first applied to the chip.

The cost of the chip and substrate assembly is also a major concern. All these concerns, taken together, present a formidable engineering challenge. Various attempts have been made heretofore to provide primary interconnection structures and methods to meet these concerns, but none of these is truly satisfactory in every respect. At present, the most widely utilized primary interconnection methods are wire bonding, tape automated bonding or "TAB" and flip-chip bonding.

In wire bonding, the substrate has a top surface with a plurality of electrically conductive contact pads or lands disposed in a ring-like pattern, The chip is secured to the top surface of the substrate at the center of the ring-like pattern, so that the chip is surrounded by the contact pads on the substrate. The chip is mounted in a face-up disposition, with the back surface of the chip confronting the top surface of the substrate and with the front surface of the chip facing upwardly, away from the substrate, so that electrical contacts on the front surface are exposed. Fine wires are connected between the contacts on the front face of the chip and the contact pads on the top surface of the substrate. These wires extend outwardly from the chip to the surrounding contact pads on the substrate. In wire bonded assembly, the area of the substrate occupied by the chip, the wires and the contact pads of the substrate is substantially greater than the surface area of the chip itself.

In the TAB process, a polymer tape is provided with thin layers of metallic material forming conductors on a first surface of the tape. These conductors are arranged generally in a ring-like pattern and extend generally radially, towards and away from the center of the ring-like pattern. The chip is placed on the tape in a face down arrangement, with contacts on the front surface of the chip confronting the conductors on the first surface of the tape. The contacts on the chip are bonded to the conductors on the tape. Ordinarily, numerous patterns of conductors are arranged along the length of the tape and one chip is bonded to each of these individual patterns, so that the chips, once bonded to the tape, can be advanced through successive work stations by advancing the tape. After each chip is bonded to the metallic conductors constituting one pattern, the chip and the immediately adjacent portions of the pattern are encapsulated and the outermost portions of the metallic conductors are secured to additional leads and to the ultimate substrate. Tape automated bonding can provide the assembly with good resistance to thermal stresses, because the thin metallic leads on the tape surface are quite flexible, and will bend readily upon expansion of the chip without imposing significant stresses at the juncture between the lead and the contact on the chip. However, because the leads utilized in tape automated bonding extend outwardly in a radial, "fan out" pattern from the chip, the assembly is much larger than the chip itself.

In flip-chip bonding, contacts on the front surface of the chip are provided with bumps of solder. The substrate has contact pads arranged in an array corresponding to the array of contacts on the chip. The chip, with the solder bumps, is inverted so that its front surface faces toward the top surface of the substrate, with each contact and solder bump on the chip being positioned on the appropriate contact pad of the substrate. The assembly is then heated so as to liquify the solder and bond each contact on the chip to the confronting contact pad of the substrate. Because the flip-chip arrangement does not require leads arranged in a fan-out pattern, it provides a compact assembly. The area of the substrate occupied by the contact pads is approximately the same size as the chip itself. Moreover, the flip-chip bonding approach is not limited to contacts on the periphery of the chip. Rather, the contacts on the chip may be arranged in a so-called "area array" covering substantially the entire front face of the chip. Flip-chip bonding therefore is well suited to use with chips having large numbers of I/O contacts. However, assemblies made by flip-chip bonding are quite susceptible to thermal stresses. The solder interconnections are relatively inflexible, and may be subjected to very high stress upon differential expansion of the chip and substrate. These difficulties are particularly pronounced with relatively large chips. Moreover, it is difficult to test and operate or "burn-in" chips having an area array of contacts before attaching the chip to the substrate. Additionally, flip-chip bonding ordinarily requires that the contacts on the chip be arranged in an area array to provide adequate spacing for the solder bumps. Flip-chip bonding normally cannot be applied to chips originally designed for wire bonding or tape automated bonding, and having rows of closely spaced contacts on the periphery of the chip.

Our own earlier U.S. Pat. Nos. 5,148,265 and 5,148,266, and our International Application PCT/US 91/06920 (Publication No. WO 92/05582) disclose significant improvements in semiconductor chip assemblies. An assembly according to one aspect of our earlier work may include a semiconductor chip having a plurality of surfaces and having contacts on at least one of said surfaces. The assembly further includes a sheet-like, preferably flexible, element having terminals thereon, the terminals being electrically connected to the contacts on the chip. Assemblies according to this aspect of the earlier work are characterized in that the sheet-like element and at least some of said terminals overlie one surface of said chip, said terminals are movable with respect to said chip and in that resilient means for permitting displacement of the terminals toward the chip, but resisting such displacement are provided. Most preferably, a compliant layer is disposed between said terminals and said chip so that said compliant layer will be compressed upon movement of said terminals toward said chip.

The complaint layer may be incorporated in the sheet-like element, or formed separately therefrom. The contacts typically are disposed on the front or top surface of the chip. The sheet-like element and terminals may overlie said front surface of the chip. Alternatively, the sheet-like element and said terminals may overlie the rear, or bottom surface of said chip. The terminals on the sheet-like element can be connected to contact pads on a substrate. Because the terminals, and hence the contact pads on the substrate overlie the chip front or back surface, the assembly is compact. The ability of the terminals to move with respect to the chip in directions parallel to the chip surfaces provides compensation for differential thermal expansion of the chip and substrate.

The ability to accommodate movement of the terminals towards the face of the chip greatly facilitates engagement of the terminals by test equipment and hence facilitates testing and "burn-in" of the assembly before the same is mounted to a substrate.

Additional aspects of our work as reflected in the patents and applications referred to above provide methods of making semiconductor chip assemblies. These methods typically include the step of assembling a flexible, sheet-like element having terminals thereon to a semiconductor chip and connecting terminals on said sheet-like element to contacts on said chip, the assembling step typically being conducted so that the terminals on the sheet-like element overlie a surface of the chip. In the methods as well, a compliant layer normally is disposed between said chip and said terminals. The methods desirably include the step of testing the chip by establishing electrical contact between a plurality of test probes and the terminals on the sheet-like element and utilizing this electrical contact to actuate the chip. Again, the compliant layer permits displacement of at least some of said central terminals toward said chip during the step of establishing electrical contact. The step of establishing electrical contact may include the step of simultaneously establishing contact between a plurality of terminals and a plurality of test probes rigidly connected to a test fixture.

Still other aspects of our earlier work provide components for assembly to a semiconductor chip including a flexible sheet-like element having terminals thereon, characterized by a compliant layer underlying the terminals.

Attempts have been made heretofore to connect semiconductor chips to substrates temporarily or permanently through so-called "dry" or "pressure" contact. As used herein, the term "pressure contact" refers to an electrical connector between two elements where electrical continuity is maintained by pressing the conductive elements against one another and maintaining that pressure force so long as the connection is maintained. Although pressure contact may involve some metallurgical bonding and/or mutual flow of the connecting elements into one another on a microscopic scale, pressure contact normally is not regarded as involving any substantial metallurgical bonding between the mating conductive elements. In this respect it differs significantly from soldering, thermal compression bonding and other commonly used connection techniques. Thus, Elder, et al. U.S. Pat. No. 5,123,850 and Jameson, et al. U.S. Pat. No. 4,783,719 disclose temporary chip testing arrangements in which conductive elements on a flexible device are placed in pressure contact with the electrical contacts on the chip itself. Enochs U.S. Pat. No. 4,597,617 discloses a different arrangement in which pressure contact is employed to connect a flexible element to a chip and also to connect leads on the flexible element to a circuit panel. This arranging incorporates a "fan out" structure similar to that utilized in conventional tape automated bonding. Here again, the leads are arranged in a generally radial pattern with inner ends engaged with the chip contacts and outer ends extending outwardly far beyond the periphery of the chip, the outer ends of the leads being engaged under pressure with the substrate or circuit board. Matta, et al. U.S. Pat. No. 5,053,922 and the article of Matta, et al. entitled Demountable Tab Aids Rework and Repair, *Connection Technology*, 26 Dec. 1991, pp. 26-30 show other, different arrangements in which a flexible tab tape having radially extensive leads in a "fan out" arrangement is engaged with a semiconductor chip, the inner ends of the leads being bonded to the contacts on the chip. The outer ends of the leads, which protrude beyond the outermost edges of the chip, are pressed against electrical conductors on a substrate so as to make the circuit between the contacts on the chip and the conductors on the substrate. Smith, et al., U.S. Pat. No. 4,628,406 discloses another arrangement using a tape-like structure with chip contacts solder-bonded to the inner ends of the leads and with the outer ends of the leads placed in pressure contact with a substrate. Matsumoto, et al., U.S. Pat. No. 4,893,172 and Norro, et al., U.S. Pat. No. 5,086,337, disclose other structures using flexible spring-like elements connected between a chip and a substrate, but in these patents both ends of each spring are metallurgically bonded to the chip and to the substrate.

Despite all of these efforts in the art, there have been needs for further improvements in semiconductor chip assemblies in methods of making such assemblies and in components useful for making such assemblies.

SUMMARY OF THE INVENTION

The present invention addresses these needs.

One aspect of the present invention provides a semiconductor chip assembly including a semiconductor chip having surfaces and having a plurality of contacts. The assembly further includes a plurality of electrically conductive terminals formed separately from the chip and positioned so that the terminals overlie a first surface of the chip. Flexible leads are provided for electrically interconnecting the contacts of the chip and the terminals so that the terminals are movable in vertical directions towards and away from the first surface of the chip, and, desirably, in horizontal directions parallel to such surface. The leads are permanently connected, as by a metallurgical bonding process to the contacts and to the terminals. Force means are provided for biasing the terminals away from the first surface of the chip. The assembly according to this aspect of the invention also includes a substrate having a contact surface and also having a plurality of contact pads on the contact surface. Means are provided for permanently holding the chip and the substrate together so that the first surface of the chip faces toward the contact surface of the substrate and so that the terminals are disposed between the chip and the substrate and the terminals engage the contacts pads on the substrate under the influence of the force applied by the force means. Most desirably, the terminals are not metallurgically bonded to the contact pads of the substrate, so that electrical continuity is maintained only by the applied forces.

Because the terminals overlie the first surface of the chip, they are encompassed within the lateral boundaries of the chip. In effect, the terminals and the force means are "sandwiched" between the chip and the substrate so that the force applied to hold the chip to the substrate is transmitted through the force means to each individual terminal and biases that terminal into engagement with the corresponding contact pad on the substrate. Because the terminals are disposed between the chip and the substrate, they can be accommodated in essentially the same area as occupied by the chip itself. The assembly may be as compact as one made by the aforementioned "flip chip" bonding process. However, the assembly can be readily made without the need for metallurgical bonding of the terminals to the contact pads of the substrate. Moreover, if the assembly must be disassembled, as where one or more parts are defective, the chip can be separated from the substrate by removing or releasing the holding means.

The substrate may incorporate additional components such as other semiconductor chips in a typical "hybrid circuit" type arrangement. Preferably, the assembly includes a flexible, sheet-like dielectric interposer top layer overlying the first surface of the chip. The interposer desirably has a first surface facing towards the first surface of the chip, and a second surface facing away from the chip, the terminals being mounted on the second surface of the interposer. The force means may include at least one resilient element disposed between the first surface of the interposer and the first surface of the chip. The resilient element may incorporate a metallic spring desirably having a plurality of independently deformable metallic spring elements. Each such metallic spring element may bear on the first surface of the interposer in alignment with one of the terminals on the second surface of the interposer. Thus, each terminal is effectively supported and biased away from the chip by one of the metallic spring elements. The metallic spring element in this arrangement need not carry any of the electrical currents and may be electrically insulated from the terminals by the sheet-like interposer itself. In one arrangement, the metallic spring may include a unitary metallic sheet overlying at least a part of the first surface of the chip, a plurality of finger-like spring elements being formed integrally with the sheet and projecting upwardly from the metallic sheet towards the first surface of the interposer.

Alternatively, the resilient element included in the assembly may include an elastomeric element disposed between the first surface of the interposer and the first surface of the chip. In this arrangement, the assembly preferably includes means for restraining the elastomeric against creep during service. Thus, where the elastomeric element includes a sheet of an elastomeric material disposed between the interposer and the chip, the means for restraining may include one or more flexible reenforcement elements mechanically engaged with the elastomeric sheet, each such flexible reinforcement element being formed from a material having creep resistance substantially higher than the creep resistance of the elastomeric material. Each such reinforcement element may extend in one or more horizontal directions, substantially parallel to the first surface of the chip, and to the first surface of the interposer.

The reinforcement element may include a metallic material and may be formed as a sheet having holes therein. The sheet may be embedded in the elastomeric sheet so that the holes in the reinforcing sheet are aligned with the terminals. Where the sheet-like interposer is formed from a polymeric material, a reinforcement element having higher creep resistance than the polymeric material embedded in the polymeric material of the interposer sheet. Alternatively, the reinforcement element may be bonded between the interposer sheet and the elastomeric sheet.

According to a further aspect of the invention, the force means may include means for containing a fluid between the first surface of the interposer and the first surface of the chip. In this arrangement, the means for holding desirably includes means for biasing the chip towards the substrate so as to place the fluid contained between the interposer and the chip under compression. The means for containing may include the interposer itself, so that the fluid is in contact with the chip-facing first surface of the interposer. The containing means may also include a bottom sheet disposed between the interposer sheet and the chip, bottom sheet may be sealed to the interposer top sheet so that they cooperatively define an enclosed chamber containing the fluid. The fluid may be a substantially incompressible material such as a liquid or visco-elastic material.

In another arrangement, the flexible leads connecting the terminals to the chip may themselves be resilient and the force means may include the flexible leads themselves. In effect, each lead may serve as its own spring or as part of its own spring. An assembly according to this aspect of the invention may further include a dielectric cover layer overlying the chip and disposed between the first surface of the chip and the top surface of the substrate. The cover layer may have holes in it and each flexible lead may include a first portion extending between the cover layer and the chip, and a second portion protruding through one of the holes in the cover layer. A polymeric encapsulant may surround at least a portion of each flexible lead. Desirably, the polymeric encapsulant includes columns of the encapsulant extending through the holes in a vertical direction away through the holes away from the chip. Each column terminates in a tip remote from the chip. Each terminal is disposed on the tip of one such column and each flexible lead may extend within one of these columns to the associated terminal.

Further aspects of the invention include methods of making semiconductor chip assemblies. As used in this disclosure, the term "permanently" used with reference to a fastening or connection means a fastening or connection which will continue for an indefinite time and which may be continued during actual use of the assembly. A permanent connection may be selectively disconnectable or else may be arranged so that the same cannot be disengaged without destroying the elements constituting the permanent connection. A method according to this aspect of the invention desirably includes the step of providing a subassembly including a semiconductor chip and also including a plurality of terminals formed separately from the chip overlying the first surface the chip. The terminals are permanently electrically connected to contacts on the chip by flexible leads permanently connected to the terminals and the contacts. The subassembly includes biasing means for biasing the terminals away from the first surface of the chip. In a further step of the method, the subassembly is engaged with a substrate so that the first surface of the chip faces toward the substrate, so that the terminals are disposed between the chip and the substrate, and so that the terminals engage contact pads on the substrate under the influence of the biasing means in the subassembly. In this manner, the contacts on the substrate are electrically connected to the contact pads on the chip through the terminals and the flexible leads. The subassembly and substrate thus form a larger, electrically interconnected assembly. Desirably, the method further includes the step of permanently fastening the substrate and the subassembly together in the engaged condition. Most preferably, the subassembly may be tested before the engaging step and the larger assembly, including the sub-assembly and the substrate may be tested after the engaging step but before the step of permanently fastening the assembly to the substrate.

Still further aspects of the present invention provide components useful in the methods and assemblies discussed above. A component according to one such further aspect of the invention may include a flexible sheet-like dielectric interposer top layer having oppositely facing first and second surfaces. A plurality of terminals are mounted on the second surface and at least one elastomeric element is mounted to the first surface of the interposer in alignment with the terminals on the second surface. The component most desirably further includes means for restraining the elastomeric element against creep. As discussed above, where the elastomeric element includes a sheet of an elastomeric material, the restraining means may include one or more flexible reinforcement elements mechanically engaged with the sheet but having substantially higher creep resistance than the elastomeric material.

A connection component according to an additional aspect of the present invention may include a similar flexible sheet-like dielectric interposer having opposite first and second surfaces and having terminals mounted on the second surface at spaced apart locations thereon. The components according to this aspect of the invention may include at least one metallic spring mounted to the second surface of the interposer. The metallic spring may include a plurality of independently deformable metallic spring elements. Each such spring element bears on the first surface of the interposer in alignment with one of the terminals on the second surface of the interposer. The at least one metallic spring element may include a metallic sheet extending generally parallel to the first surface of the interposer, a plurality of the spring elements being formed integrally with the metallic sheet and projecting therefrom towards the first surface of the interposer. Each such spring element may be a finger-like element having a base end connected to the metallic sheet and a tip end remote from the metallic sheet bearing on the first surface of the interposer.

Still further components according to this aspect of the invention may includes dielectric layer and a plurality of leads mounted to the dielectric. Each lead may have at least one resilient, vertically extensive projection section extending upwardly from a bottom end to a top end, the top ends of the leads defining terminals for engagement with the substrate. According to one aspect of the invention, each such lead should also have a contact end electrically connected to the projection section but spaced apart therefrom in a horizontal direction parallel to the dielectric layer. The terminals and the projection sections of the leads may be disposed on a central region of a sheet-like dielectric interposer whereas the contact ends of the leads may be disposed in a peripheral region of the interposer surrounding the central region.

According to a further aspect of the invention, the component may include a compliant encapsulant projecting upwardly around the projection sections of the leads. The terminals at the top ends of the projection sections may be exposed atop the encapsulant, so that the encapsulant aids in positioning the projection sections and the terminals. Where the encapsulant is resilient, the encapsulant may act as an auxiliary resilient element. Moreover, the encapsulant substantially prevents damage to the leads during handling and/or assembly with the chip and substrate. The encapsulant may be arranged in columns spaced apart from one another and extending upwardly from the interposer so that each terminal is disposed on a tip of one such column.

According to yet another aspect, a semiconductor chip connection component in accordance with the invention may include a flexible interposer as aforementioned, terminals mounted on the second surface of the interposer and reservoir means for defining a fluid reservoir extending on an opposite, first surface of the interposer, and for retaining a fluid within the reservoir so that when the fluid is placed under pressure the pressure on the fluid will be applied over the first surface of the interposer. Thus, because the interposer is flexible and sheet-like, the fluid pressure applied on the interposer will bias the individual terminals. The reservoir means may include the sheet-like interposer itself and may also include a flexible membrane or bottom sheet extending generally parallel to the interposer and sealed thereto so that the membrane and the interposer cooperatively define a sealed chamber.

These and other objects, features and advantages of the present invention, will be more readily apparent from the detailed description of the preferred embodiment set forth below taken in conjunction with the accompanying drawings.

DETAILED DESCRIPTION OF THE PREFERRED EMBODIMENTS

Figure 1:
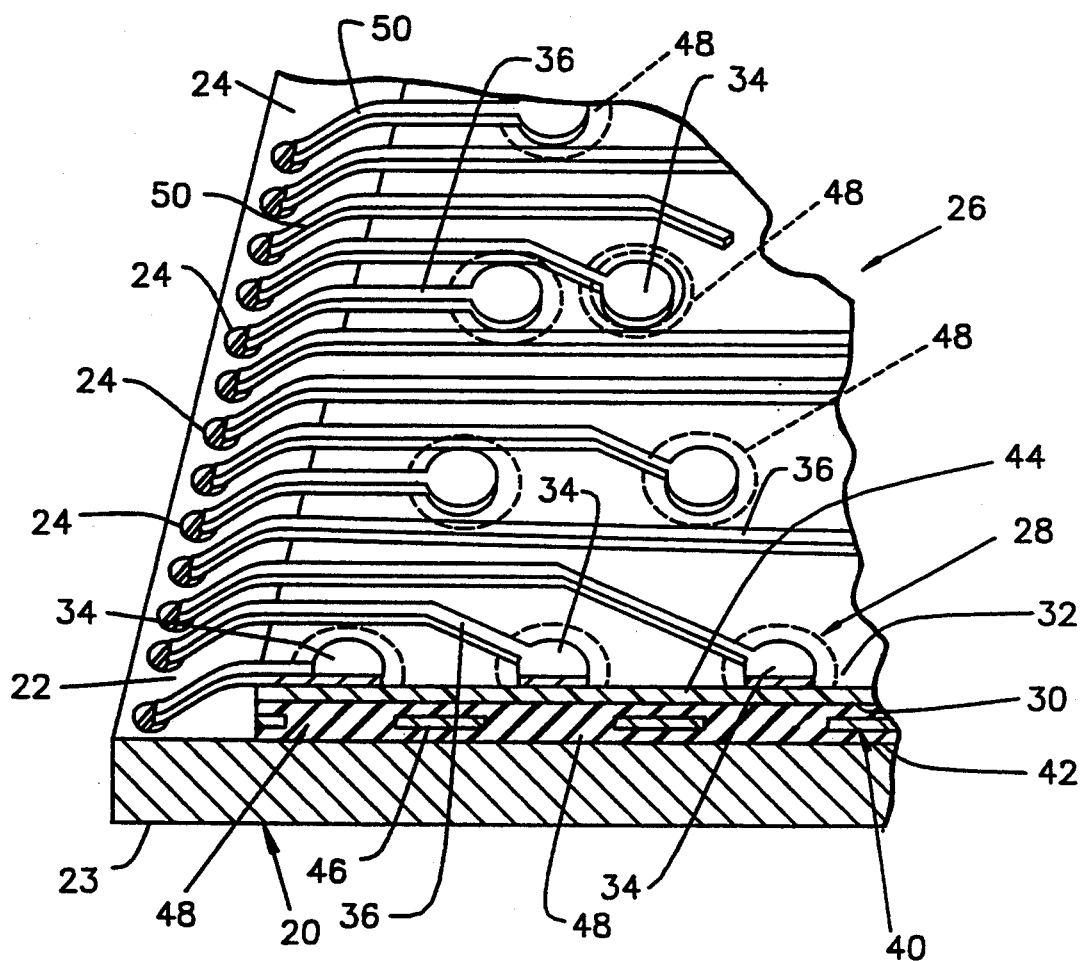
FIG. 1 is a fragmentary, diagrammatic, partially-sectional view showing a sub-assembly in accordance with one embodiment of the present invention.

A subassembly in accordance with one embodiment of the present invention includes a conventional semiconductor chip 20 having internal electronic circuitry (not shown). Chip 20 is generally in the form of a rectangular solid, and has a first or top surface 22, and a second or bottom surface 23 generally parallel to the top surface. A large number of electrically conductive chip contacts 24 are provided on first surface 22. In the particular chip illustrated, contacts 24 are provided around the periphery of surface 22 in elongated rows adjacent the edges of the surface. Only one such row is visible in that portion of the chip shown in FIG. 1. The terms "upwardly" and "downwardly" are used in portions of this disclosure to describe directions with respect to assemblies incorporating a semiconductor chip. As used herein, unless otherwise indicated such terms should be taken as referring to a frame of reference based upon the chip itself in which the upward direction is the direction out of surface 22 away from the chip (towards the top of the drawing in FIG. 1) and the downward direction is the opposite direction into the chip from surface 22. The term "vertical" is used to refer to these upward and downward directions, whereas the term "horizontal" refers to directions transverse to the vertical directions.

The assembly further includes a connection component 26 incorporating a flexible, sheet-like dielectric interposer or top layer 28. Interposer 28 has a first generally planar major surface 30 facing toward the chip and a second, oppositely directed major surface 32 facing upwardly away from the chip. A plurality of electrically conductive terminals 34 are disposed on the second surface 32 of interposer 28. In the particular arrangement shown, terminals 34 are disposed at substantially even spacings on a central region of surface 32 so that the terminals constitute a "area array". Each terminal 34 is formed integrally with a lead 36. Each lead 36 includes a bonding portion 50 projecting outwardly beyond the edge of interposer 28. Terminals 34 and leads 36 may be formed from substantially any electrically conductive material, but preferably are formed from metallic materials such as copper and copper alloys, nickel, noble metals and noble metal alloys. These components may be fabricated on the top or second surface 32 of the interposer 28 by conventional photolithographic, etching or deposition techniques.

Interposer 28 is relatively thin and flexible. Desirably, the interposer is formed from a layer of a relatively high elastic modulus polymeric material such as a polyimide or other thermosetting polymer, or a fluro-polymer or thermoplastic polymer. Although the interposer should be flexible, it should be dimensionally stable at the temperatures to be encountered in service. That is, the dimensions of the interposer in directions parallel to its major surface should be substantially stable. Where a polyimide layer is used, interposer 28 may be between about 0.01 mm and about 0.1 mm thick, more desirably about between about 0.012 mm and 0.050 mm thick. Leads 36 desirably are flexible. Thus, the metallic material used to form the leads 36 desirably is less than about 0.005 mm thick, more desirably less than about 0.025 mm thick most desirably between about 0.01 and 0.02 mm thick. The bonding portion 50 of each lead 36 desirably is about 0.01 mm and about 0.1 mm wide, more preferably between about 0.025 and about 0.05 mm wide.

Connection component 26 further includes a sheet-like resilient layer 40 formed from an elastomeric material. The elastomeric material utilized in layer 40 desirably has elastic properties comparable to those of relatively soft rubber from about 20 to about 70 Shore A Durometer. The resilient layer desirably is about 0.05 mm to about 0.5 mm thick, more desirably between about 0.1 mm and about 0.2 mm thick. Resilient layer 40 has a bottom surface 42 facing away from interposer 28 and a top surface 44 abutting the first surface 30 of interposer 28. A reinforcing element in the form of a thin, flexible but substantially inextensible sheet 46 is embedded within resilient elastomeric layer 40. Reinforcing sheet 46 is substantially co-extensive with the elastomeric sheet 40 and with interposer 28. The reinforcing sheet extends within layer 40 in horizontal directions, generally parallel to interposer 28. Reinforcing sheet 46 is provided with a plurality of holes 48. The holes in the reinforcing sheet are aligned, in the horizontal directions, with terminals 34. Thus, each terminal 34 overlies one hole 48 in the reinforcing sheet. Desirably, each hole in the reinforcing sheet is slightly larger in diameter than the overlying terminal 34.

Reinforcing sheet 46 is formed from a material having substantially greater creep resistance than the material of elastomeric sheet 40. The term "creep" as used herein means increase in strain over a prolonged time while the material is subjected to a constant stress. Most preferably, the reinforcing element 46 is formed from a material having essentially zero creep at temperatures of 150° or less. Reinforcing element 46 may be formed from a wide variety of materials, including polymeric materials, carbonaceous materials, glass, ceramic, and glass ceramic materials and metals and combinations and/or composites including these materials. Most preferably however, the reinforcing element 46 is formed from a metallic material such as copper. At the maximum service temperatures typically encountered and levels of strain below their elastic limits, metals typically do not exhibit any appreciable change of stress with time.

Reinforcing element 46 is embedded within elastomeric layer 42 and bonded to the elastomeric material of the layer. This may be accomplished by extruding or coating the elastomeric material on the reinforcing element or by molding the elastomeric material around the reinforcing element. Alternatively, the assemblage including the elastomeric material and the reinforcing element can be fabricated by laminating a plurality of thinner elastomeric layers with the reinforcing element therebetween, and subjecting the elastomeric material to curing, as under heat and pressure, so as to unite the elastomeric materials within the holes 48 of the reinforcing element. If desired, the reinforcing element can be surface treated or pre-coated with an adhesion-enhancing materials before uniting it with the elastomeric material. The interposer top layer 28 may also be bonded to the surface of the elastomeric layer. The elastomeric layer may also be formed in contact with the interposer and by curing the elastomeric material in place on the first surface of the interposer with the reinforcing element 46 in place.

In an assembly method according to a further aspect of the invention, connection component 26 is assembled with chip 22 so that elastomeric layer 40 abuts the first or top surface 22 of chip 20 as illustrated in FIG. 1. In this condition, the first surface 30 of interposer top layer 28 faces towards the chip, whereas the second surface 32 and terminals 34 face away from the chip. Also, the connection component, and hence terminals 34, overlie a central region of chip-front surface 22 within the area encompassed by the rows of chip contacts 24. The bonding portions 50 of the leads 36 on the connection component are connected to the contacts 24 of the chip. The bonding process may be performed using essentially conventional equipment and techniques. Such techniques typically include application of heat, ultrasonic energy and pressure in some combination. These conventional techniques include thermosonic, thermocompression and ultrasonic bonding. The bonding process connects each bonding portion 50 to one contact 24 of the chip. Accordingly, after the bonding step, each terminal 34 is electrically connected to one contact 24 on the chip via the associated flexible metallic lead 36.

The subassembly may then be tested by forcibly engaging the subassembly with a test fixture. Preferably, the test fixture includes a plurality of fixed test probes, such as a plurality of small metallic probes mounted on a single rigid test probe body. A plurality of the test probes are simultaneously engaged with a plurality of terminals 34. Most preferably, the test probe includes test probes equal in number to the number of terminals on the subassembly. Because the interposer top layer 28 is flexible and because layer 40 is resilient and deformable, each terminal 34 may be displaced independently of the other terminals in the downward direction, towards the chip front surface 22, as the subassembly is engaged with the test fixture. Accordingly, minor imperfections in the height or vertical extent of the test probes and/or the terminals, do not prevent effective engagement of all terminals simultaneously by the test fixture. Ordinarily, the test fixture is provided with appropriate electrical connections to allow operation of the chip. Because all of the terminals, and hence all of the contacts on the chip can be connected simultaneously, the entire chip can be tested at this stage of the operation. The test also provides a test of the connection component and of the wire bonds. If the subassembly is found to be defective, the same may be readily reworked or discarded at this stage. Even where the cost of the chip itself does not justify rework, the ability to detect defective sub-assemblies at this stage avoids production of defective assemblies in the later stages of the process.

Figure 2:
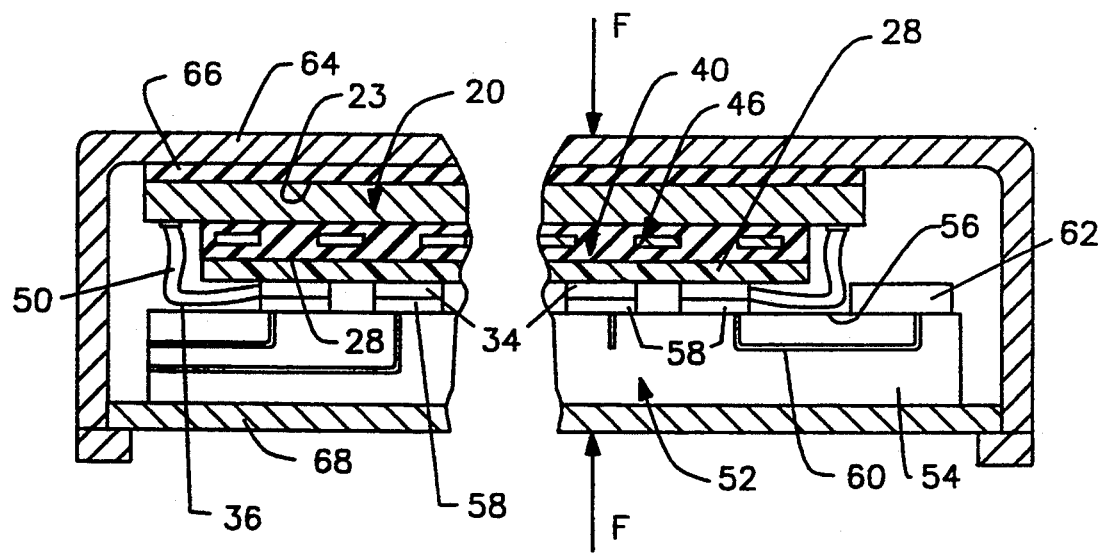
FIG. 2 is a fragmentary, diagrammatic sectionally view showing an assembly incorporating the sub-assembly of FIG. 1 with the vertical scale enlarged for clarity of illustration.
Figure 3:
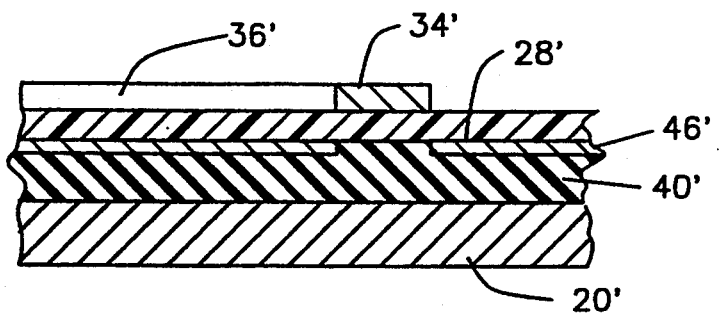
FIGS. 3, 4, 5 and 6 are fragmentary, diagrammatic sectional views depicting portions of sub-assemblies in accordance with further embodiments of the invention.

In the next stage of the process, the subassembly including the chip and the connection component is assembled with a substrate 52 (FIG. 2). Substrate 52 includes a body 54 having an exposed surface 56 and a plurality of contact pads 58 disposed on the exposed surface. The contact pads 58 are disposed in a pattern corresponding to the pattern of the terminals 34 on the interposer. The substrate may have additional electronic components, such as one or more additional semiconductor chips 62 mounted thereon. The substrate further includes means, such as the leads 60 indicated schematically in FIG. 2, for interconnecting terminals 58 with one another, and/or with the additional electronic components. Substrate 52 may be a conventional single layer or multi-layer circuit panel having leads 60 disposed in one layer or in several superposed layers. The body of the substrate may be formed from essentially material conventionally employed in fabrication of semiconductor mounting substrates as, for example, ceramic or polymeric materials. The substrate may also have pins or other connecting devices (not shown) for connecting some or all of the contact pads to other, external electronic devices. For example, the substrate may be provided with pins for engagement in a socket mounted on a circuit board.

In the assembly process, the subassembly of the chip and the connection component is engaged with the substrate so that the terminals 34 are disposed between the chip 20 and the substrate and so that the terminals bear on the contact pads 58 of the substrate. The chip is pressed towards the substrate as schematically indicated by force vectors F thereby compressing the resilient elastomeric layer 40 between the terminals and the chip. The compressed elastomeric layer bears on the flexible interposer layer 28, and hence biases the interposer layer and the terminals away from the chip and towards the interposer. The compressed elastomeric layer thus forces each terminal into engagement with the corresponding contact pad on the substrate. The chip subassembly and the substrate may be temporarily pressed towards one another by a temporary clamping fixture (not shown). In this temporarily assembled condition, the chip can be operated in conjunction with the other components mounted on the substrate, and hence the entire assembly can be tested. The chips subassembly and the substrate are then permanently fastened together. As illustrated in FIG. 2, the bottom surface 23 of chip 20 is engaged with a metallic can 64. A thin layer 66 of a conformable heat transfer material such as a filled polymer is interposed between the chip bottom surface 23 and can 64. The filled polymer may include BN, $Al_2O_3$, silver or other heat conducting filler material. Substrate 52 is disposed on a metallic plate 68. Can 64 is pressed towards plate 68 and fastened thereto as by crimping, welding, riveting, screws or other fasteners, thus permanently holding the chips subassembly and the substrate together. In this permanently engaged condition, as in the temporarily engaged condition discussed above, the terminals are disposed between the chip and the substrate, with the elastomeric resilient layer lying between terminals and the chip. Here again, the elastomeric layer bears on the terminals through the flexible interposer layer 28, thereby biasing the terminals 34 away from the chip and towards the contact pads 58 on the substrate. The force exerted by the resilient elastomeric layer thus maintains the terminals in contact with the contact pads of the substrate.

The resilient biasing means ensures effective engagement of all terminals with all of the terminals on the interposer with all of the contact pads on the substrate even where there are minor differences in elevation of the terminals and/or the contact pads, and even where the chip surfaces are not precisely parallel to the surfaces of the substrate. The maximum vertical displacement of two adjacent terminals which can be accommodated by the assembly without damage is referred to herein as "the vertical compliance" of the subassembly. The degree of vertical compliance required to accommodate such imperfections will depend, in part, upon the tolerances allowed in the chip and in the substrate. Typically however, vertical compliance of about 0.012 mm (0.0005 inches) is sufficient to compensate for the imperfections encountered.

In service, resilient elastomeric layer 40, and particularly those portions of the resilient elastomeric layer immediately underlying terminals 34, is under a continual load. That loading tends to cause gradual, progressive deformation of the elastomeric layer. Such progressive deformation ordinarily is not a significant factor during the relatively short-duration engagement of the chip and connection component subassembly with the test probe, or during temporary assembly of the chip and connection component subassembly with the substrate for test purposes. However, in use of the final assembly, where the chip and component subassembly is permanently secured to the substrate, the constant loading applied to the resilient elastomeric layer could cause significant permanent deformation or "set" of the resilient elastomeric layer 40. This in turn tends to reduce the force applied to each terminal by the elastomeric layer, and hence tends to reduce the engagement force between each terminal and the associated contact pad on the substrate with passage of time. The reinforcing layer 46 substantially prevents such permanent deformation or set, inasmuch as it substantially restrains the elastomeric material of the layer from flowing.

Figure 4:
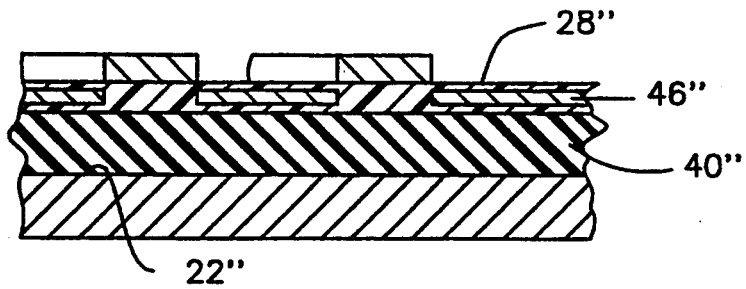
Figure 5:
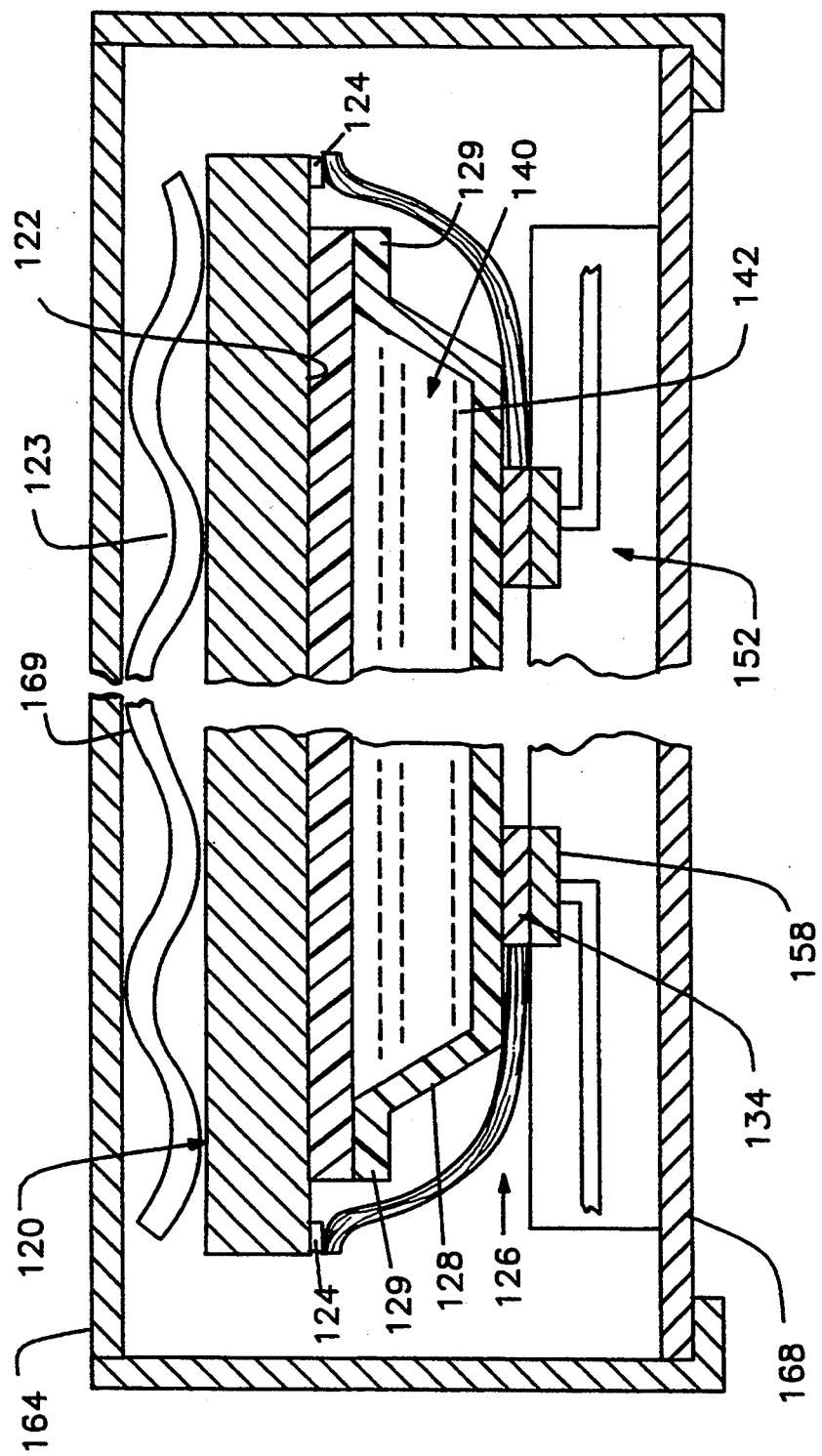

A subassembly according to a further embodiment of the invention (FIG. 5) includes a flexible interposer top layer 28' having terminals 34', and leads 36' thereon, together with a chip 20' all essentially the same as those discussed above with reference to FIGS. 1 and 2. The subassembly further includes a resilient, elastomeric layer 40' and a substantially inextensible sheet-like reinforcing element 46'. These elements are also similar to those discussed above, except that the reinforcing element 46' is disposed at the interface between interposer top layer 28' and the resilient, elastomeric layer. The reinforcing element desirably is bonded to the immediately adjacent surface of the resilient layer 40'. The embodiment of FIG. 4 is also similar, except that here the reinforcing element 46" is embedded within the interposer top layer 28". In this case, the resilient layer 40" desirably is bonded to the interposer top layer 28", so that horizontally directed forces, in directions generally parallel to the planes of the various layers and parallel to the chip top surface 22" will be transmitted between the resilient layer and the reinforcing layer through the intervening portions of interposer top layer 28".

An assembly according to a further embodiment of the invention (FIG. 5) incorporates a chip 120 as aforesaid and a connection component 126. As in the embodiments discussed above, the connection component includes a flexible interposer top layer 128 and terminals 134 mounted on the second or top surface of layer 128. In this arrangement, however, the margins 129 of layer 128 are bonded to a bottom layer 132 so that the interposer top layer 128 and bottom layer 132 cooperatively define a sealed chamber 140. Chamber 140 is filled with a substantially incompressible fluid. As used herein, the term "fluid" refers to material capable of flow to at least some degree, so as to substantially redistribute itself in response to applied pressure, such the applied pressure will be substantially equalized by displacement of the fluid. Thus, fluid materials include Newtonian liquids, non-Newtonian fluids such as thixotropic and dilatant materials and visco-elastic materials such as gels, gelatins, uncured or partially cured rubbers, pastes and the like. The connection component is positioned on the top or first surface 122 of the chip so that the bottom layer 132 bears on the chip surface, and so that the terminals 134 and interposer top layer 128 overlie the chip, with chamber 140 disposed between the top layer and the chip surface. As in the embodiments discussed above, the terminals 134 on the connection component are electrically connected to the contacts 124 of the chip itself by flexible leads. As in the embodiments discussed above, the subassembly incorporating the chip and connection component is assembled with a substrate 152 and permanently held together with the substrate so that the terminals and the second surface of the interposer face toward the substrate with the terminals 134 being engaged with contact pads 158 on the substrate. In this arrangement, however, the holding device includes means for biasing the chip itself towards the substrate. In the arrangement illustrated, a can 164 and plate 168 are permanently fastened together to hold the chip and substrate together. A corrugated spring 169 is disposed between the bottom surface 123 of the chip and the adjacent surface of can 164, so that the spring biases the chip and connection component subassembly away from can 164 and towards plate 168 and substrate 152. The chip front surface 122 thus bears on the bottom layer 132 of the connection component and places the fluid 142 within the chamber under pressure. The pressure in the fluid ten to push flexible interposer top layer 128 and hence contacts 134 away from the chip, thereby biasing the terminals 134 into engagement with the contact pads 158. Here again, the system offers significant vertical compliance. That is, the vertical position of each terminal relative to the top surface of the chip has only a relatively slight effect on the biasing force and hence on the force of engagement between the terminal 134 and the associated contact pad 158. The fluid tends to equalize the contact pressures on all of the terminals. Of course, the particular arrangement of a spring and a can assembly illustrated in FIG. 5 can be replaced by other devices for holding the chip and substrate together while maintaining bias of the chip towards the substrate. Other, conventional types of biasing elements such as coil, cantilever and other types of solid springs can be used. In principle, other force-applying devices can be employed as well, such as fluid pressure actuated devices and devices actuated by electrical or magnetic forces. These devices are less preferred because they add size, cost and complexity to the system.

Figure 6:
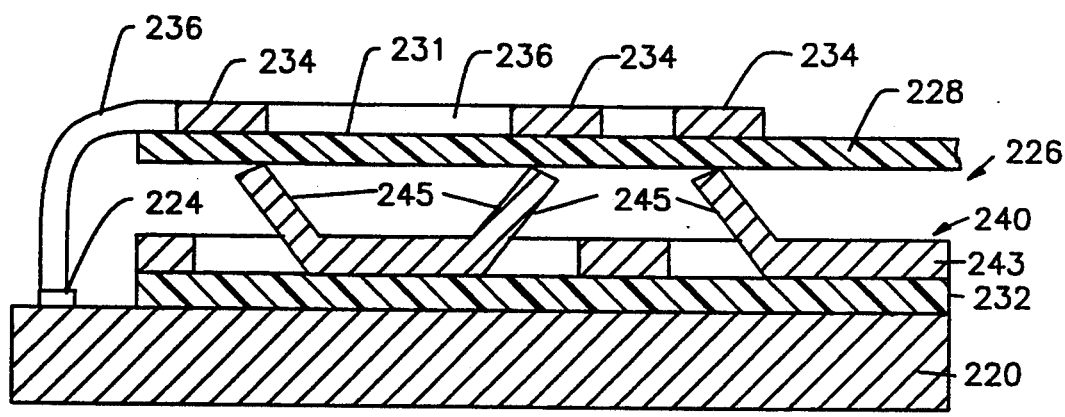

As illustrated in FIG. 6, a subassembly in accordance with another embodiment of the invention includes a connection component 226 having a flexible interposer top layer 228, with terminals 234 and leads 236 extending on the second or top surface 231 of interposer top layer 228. This connection component further includes a bottom layer 232. Disposed between the bottom layer 232 and the top layer 228 is a sheet-like metallic spring 240.

Figure 7:
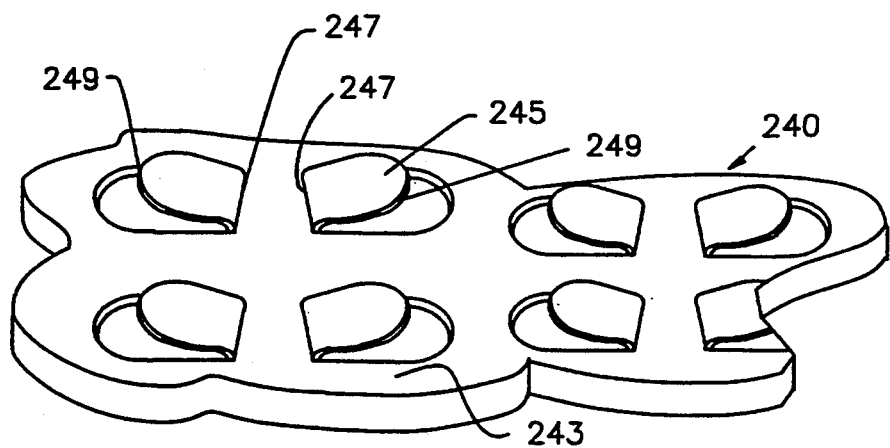
FIG. 7 is a fragmentary, diagrammatic perspective view depicting portions of a part used in the sub-assembly of FIG. 6.

Spring 240 is generally planar and, in the horizontal directions, is substantially co-extensive with the top layer 228. Thus, spring 240 underlies all of the terminals 234. As best seen in FIG. 7, spring 240 includes a metallic sheet 243 and a plurality of fingers 245 protruding upwardly from sheet 243. Each finger 245 has a base end 247 joined to the sheet and a tip end 249 remote from the sheet. The fingers are arranged on the sheet in generally back-to-back orientation, so that the base end 247 of each finger faces towards the base region of an adjacent finger, and so that the tips 249 of fingers having adjacent bases protrude away from one another. The spacing between the tips of adjacent fingers 245 is selected to correspond with the spacing between adjacent contacts 234.

In the connection component, each finger is associated with one terminal 234. The tip of each finger is disposed beneath the associated terminal 234.

As depicted in FIG. 6, the connection component is assembled to a chip 220. Bottom layer 232 serves to electrically insulate any electrically conductive components of chip 220 from the spring 240. Likewise, interposer top layer 228 electrically insulates the terminal 234 from spring 240. In other respects, the connection component 226 illustrated in FIG. 6 is used in essentially the same manner as the connection components discussed above with reference to FIGS. 1–4. Thus, the leads 236 and hence the terminals 234 are connected to the contacts 224 of the chip. The resulting subassembly is then tested and permanently fastened together with a substrate so that the terminals 234 of the connection component bear on the contact pads of the substrate (not shown). The permanent fastening device used with this connection component need not incorporate any biasing elements or springs. Provided the subassembly and the substrate are maintained in sufficiently closed proximity to displace terminals 234 towards chip 220, the fingers 245 of spring 240 will be bent from the undisturbed position illustrated in FIG. 6. Each such finger therefore will tend to return to the undistorted position under its own resilience, and hence will bias the associated terminal 234 away from the chip and toward the substrate. The individual, independently deformable metallic spring elements in the form of fingers 245 provide individual vertical compliance. Thus, each contact 234 can be independently displaced towards the chip and towards bottom layer 232. Desirably, the dimensions of the components are selected so that when the chip and the substrate are permanently held together, all of the fingers 245 are deformed to at least some degree. In this arrangement, each terminal typically has at least about 0.012 mm (0.0005 inches) vertical compliance. That is, each terminal can be displaced through a range of at least about 0.012 mm from its free or unloaded position to the point where the finger associated with the terminal has been fully flattened into the plane of the spring sheet 243. The dimensions of the components desirably are selected so that for nominal, perfect components of each spring finger would be deformed to about one-half of the vertical compliance. Thus, each finger or spring element will be capable of taking up substantial deviations from nominal positioning while still maintaining the contact pressure between the associated terminal and substrate compact pad within reasonable limits.

The spring 240 can be formed by conventional metal working techniques such as progressive die forming. Desirably, the sheet 243 is between about 0.01 and about 0.04 mm thick, and each finger is about 0.25 mm long from its base end 247 to its tip 249. With respect to loads applied at the tips of the fingers, each finger desirably provides a spring constant of about 10N/mm. The spring may be formed from conventional metals of the types commonly utilized for spring, such as spring steels, brass, beryllium copper and spinodal copper-based alloys. In this regard, the electrical characteristics of the spring material normally are unimportant, as the spring material does not carry out electrical currents during service.

A connection component 326 (FIG. 8) according to yet another embodiment of the invention includes a layer 328 formed from a dielectric material. Dielectric layer 328 has a first surface 330 facing downwardly and a second, upwardly facing surface 332. Dielectric layer 328 has a central portion 329 and a peripheral region 331 adjacent the edges of the layer. Holes 335 are formed in the central region 329 of layer 328. A plurality of flexible metallic leads are mounted to dielectric layer 328. Each such lead has a vertically extensive, resilient connection section 337 extending upwardly through one of the holes 335 in the dielectric layer. Thus, the number of leads is equal to the number of holes. Each lead 334 further includes a contact section 339 formed integrally with the projection section 337 and extending on the bottom or first surface 330 of dielectric layer 328. Each contact section 339 defines a contact end 341 electrically connected to the projection section 337 of the same lead but remote therefrom in a horizontal direction. In the arrangement illustrated, the contact ends 341 of the leads are disposed adjacent to the peripheral region 331 of layer 328, and extend outwardly, in horizontal directions, beyond the periphery of layer 328. The projection section 337 of each lead has a bottom end 347 at its juncture with the contact end section 339 of the lead and a tip 349 remote from the contact end 339, the top end 349 of each projection section defining a terminal for the lead. The projection section extends in an oblique direction, so that the tip 349 is offset both vertically and horizontally from the bottom and 347.

A layer 350 of a deformable, compliant encapsulant is disposed on the first or bottom surface 330 of layer 328, so that the contact end sections 339 of the leads are covered by the encapsulant and hence trapped between the encapsulant and dielectric layer 328. Columns of encapsulant 352 formed integrally with layer 350 protrude upwardly through the holes 335 in dielectric layer 328. Each such column has a top end projecting vertically above the second or top surface 332 of layer 328. The projection section 337 of each lead is substantially surrounded by one such column 352 of encapsulant. However, the terminal-defining top end 349 of each projection section is exposed and lies on the top of the associated encapsulant column 352.

Figure 8:
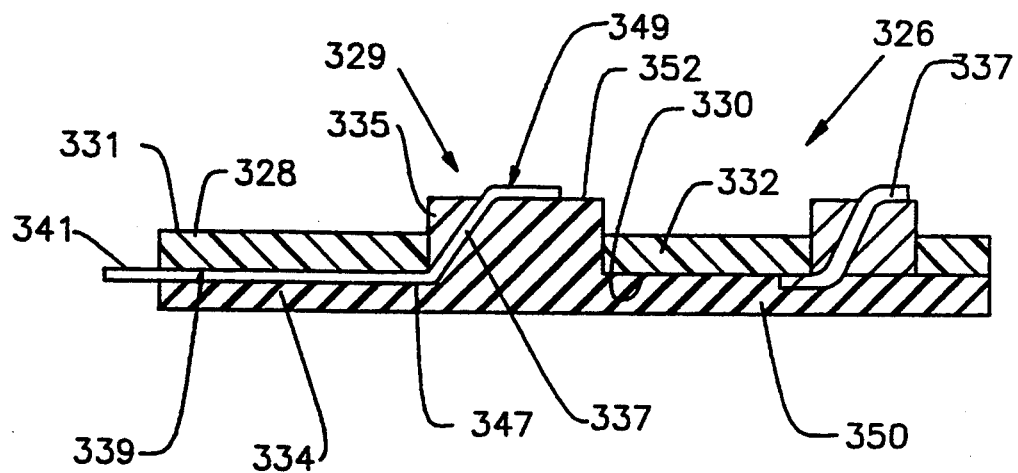
FIG. 8 is a fragmentary, diagrammatic sectional view showing a sub-assembly in accordance with a further embodiment of the invention.

The connection component of FIG. 8 is employed in substantially the same way as discussed above with respect to FIGS. 1–4. Thus, the component is assembled with a chip 320 so that the central portion 329 of the dielectric layer, and hence holes 335, columns 352 and terminals 349 overlie the central region of the chip front or top surface 322. The contact ends 341 of the leads on the connection components may be directly bonded to the contacts 324 of chip 320, as by thermocompression bonding of the leads to the chip contacts. Alternatively, the contact ends 341 may be joined with the chip contacts through a wire bonding process as discussed above. The subassembly may be tested as discussed above by engaging the various terminals 349 with a test fixture (not shown) and by temporarily engaging the subassembly of the connection component with the substrate 382. After testing, the connection component and chip subassembly is fastened together with the substrate 382. Here again, the terminals or connection section top ends 349 bear on contact pads 384 of the substrate. The projection sections 337 of the leads are deformed, and hence the resilience of the leads themselves biases the terminals or projection section top ends 349 away from the chip 320, towards the substrate and the contact pads. Thus, the resilience of the projection sections 337 maintains terminals 349 in engagement with contact pads 384 of the substrate. The encapsulant, particularly in encapsulant columns 352, is deformed when the chip end connection component are united with the substrate. Thus, the encapsulant, to the extent the same is resilient, may also bias the terminals into engagement with the substrate contact pads. However, it is not essential that the encapsulant be resilient or that the encapsulant resist creep, provided that the leads themselves are configured to provide adequate biasing forces. Whether or not the encapsulant columns provide any terminal biasing forces in service, they do provide very significant advantages during manufacture. Thus, each encapsulant column retains the associated projection section against damage during handling and during assembly procedures. Moreover, the encapsulant keeps dirt out of holes 335 in the dielectric layer.

Figure 9:
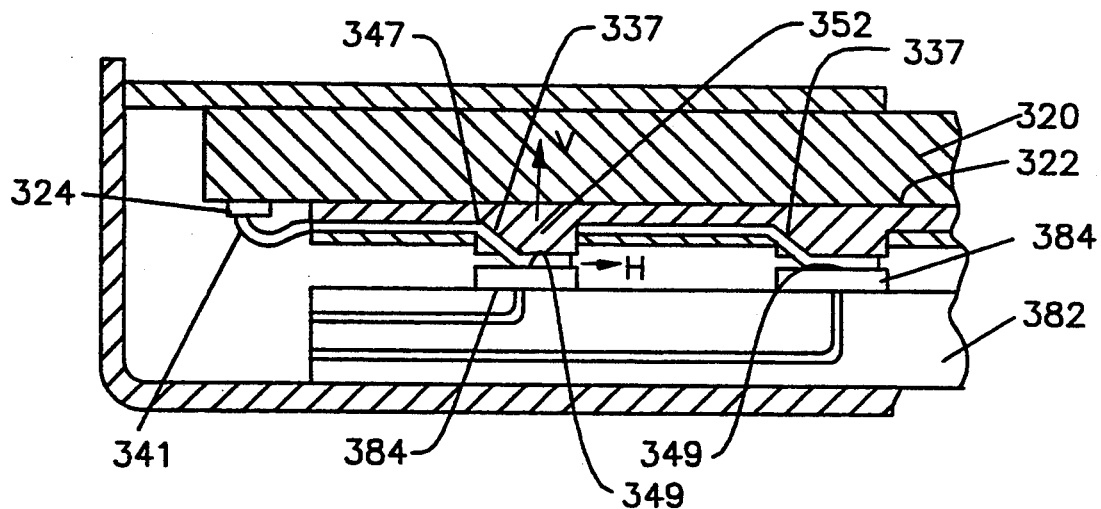
FIG. 9 is a fragmentary, diagrammatic sectional view depicting portions of an assembly incorporating the sub-assembly of FIG. 8.

When the tip 349 of the projection section 337 of each lead engages a contact pad 384 of the substrate during the assembly process, the tip 349 is displaced in the vertical or downward direction, toward the chip 320, as indicated by the Arrow V in FIG. 9. Because projection section 337 extends in an oblique direction, vertical displacement of the tip 349 causes bending of the projection section 337 over its entire length and also pivoting of the connection section about the bottom end 347 of the connection section. Such bending and pivoting cause the tip 349 of the connection section to move in a horizontal direction, parallel to the plane of the chip surface. This horizontal movement causes the tip 349 to wipe across the surface of the associated contact pad 348. This wiping action is useful in assuring reliable electrical interconnection between the tip of the projection section and the contact pad.

Figure 10A:
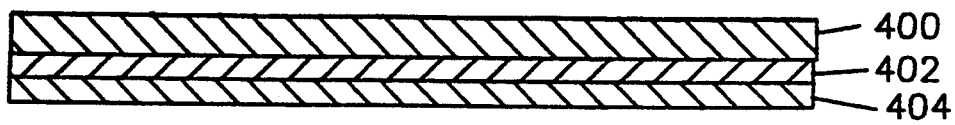
FIGS. 10A through 10G are fragmentary, sectional views depicting process steps used in the manufacture of a part employed in the embodiment of FIGS. 8 and 9.
Figure 10B:
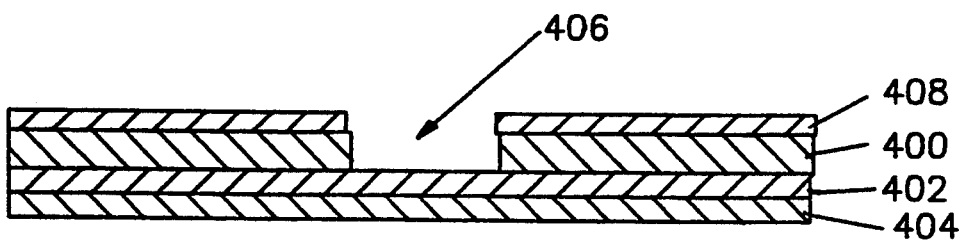
Figure 10C:
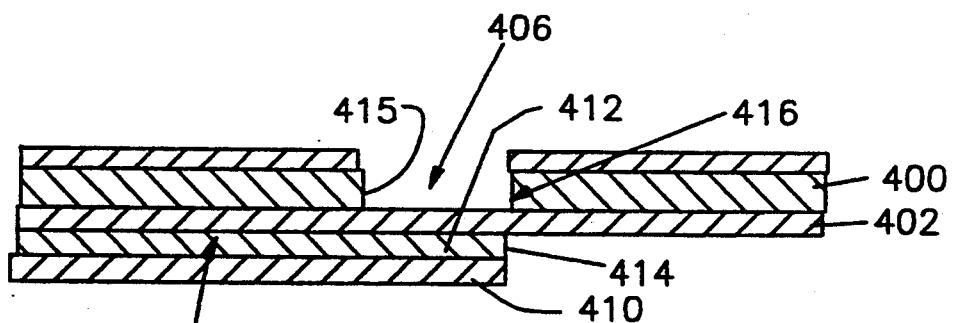

A connection component as illustrated in FIGS. 8 and 9 may be fabricated by a process according to a further embodiment of the invention. As shown in FIG. 10A, the process begins with a laminate including a relatively thick, strong support 400 formed from a substantially rigid material such as aluminum. The laminate further includes a dielectric, sheet 402 formed from a material such as polyimides and also includes an electrically conductive terminal material layer 404 formed from a metal or other material suited to form the electrical terminals, contacts and leads. Layer 404 may itself include multiple layers (not shown) of different materials such as metals. In the first stage of the process (FIG. 10B), openings 406 are formed at the locations where holes in the dielectric sheet and projecting contacts and terminals are ultimately desired. Thus, the support layer 400 may be covered with a masking layer 408 having holes at the desired locations, as by conventional selective curing processes, and the laminate is immersed in a suitable etchant which attacks the aluminum material of the support layer. If the etchant will also attack the terminal material 404, a masking coating may be applied to the side of layer 404 remote from dielectric layer or sheet layer 402. In the next stage of the process (FIG. 10C) the terminal material layer 404 is selectively etched to form individual lead precursors 411 on the side of the dielectric layer 402 remote from support layer 400. Each such lead precursor includes a finger portion 412 projecting partially across one of the holes 406 in support layer 400. Thus, each such finger 412 projects past one edge 415 of the associated hole but terminates at a tip 414 just short of the opposite edge 416 of the hole. The selective etching may be performed by selectively applying a masking material 410 on the side of terminal material layer 404 remote from the dielectric layer 402, and then immersing the assembly in a suitable etchant to remove the terminal material in the unmasked areas. During this removal process, the dielectric layer 402 protects the fingers 412 from attack by etchant in the holes 406.

Figure 10D:
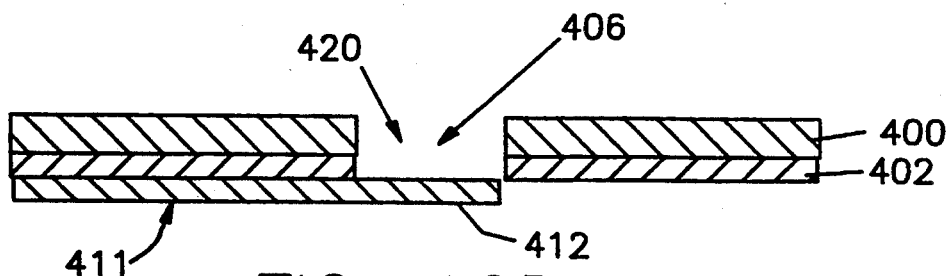
Figure 10E:
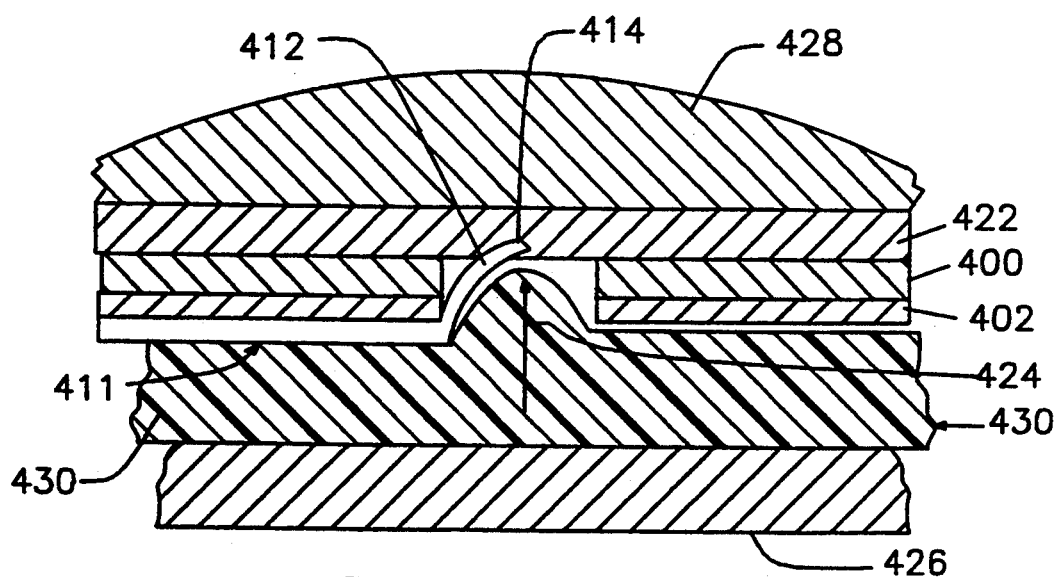
Figure 10F:
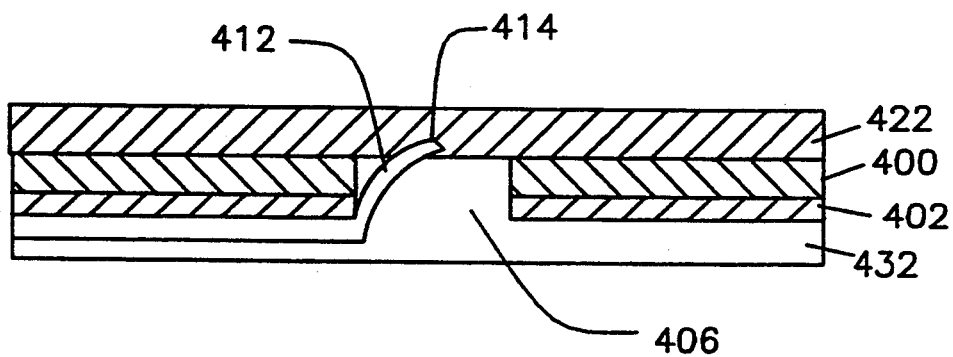
Figure 10G:
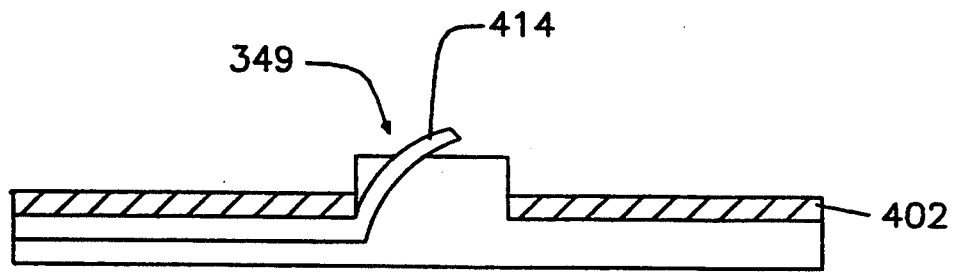

After forming the fingers, openings 420 (FIG. 10D) are formed in dielectric layer 402 in registration with the holes 406 of support layer 400. In this process, the support layer 400 acts as a mask for the dielectric layer. The aluminum material of support layer 400 is impervious to the etchant used to attack the dielectric layer. Alternatively, openings 420 in dielectric layer 402 can be formed by laser ablation. Thus, radiant energy can be focused on dielectric layer 402 through holes 406. After forming openings 420 in the dielectric, and after removing any masking layer residues, a temporary buffer layer 422 (FIG. 10E) is applied to the top side of support layer 400, remote from polyimide layer 402. Buffer layer 422 desirably is formed from a polymer such as polyvinyl chloride, polyethylene, polypropylene or the like. The buffer layer is applied by laminating a sheet of the desired polymer to the support layer 400. As best seen in FIG. 10E, buffer layer 422 bridges over the holes 406 in support layer 400. Following application of buffer layer 422, the fingers 412 are deformed upwardly through the openings in the dielectric layer 402 and through the holes 406 in the support layer 400 by applying upwardly directed forces, as indicated by arrow 424, to the fingers. The fingers are bent upwardly in this fashion until the tips of the fingers are engaged with buffer layer 422. Because the upward bending of each finger is arrested by engagement with buffer layer 422, there is no need for particularly precise control of the upwardly directed bending force. Thus, the force may be applied by placing the laminate between a pair of opposed platens 426 and 428, with an elastomeric material 430 between the lower platen 426 and the bottom of the assemblage, and then forcing the platens together so as to force elastomer material 430 into holes 406 and thereby bend the fingers upwardly. Alternatively, a rigid metallic die having prongs or projections in registration with holes 406 may be employed. The height or vertical extent to which each finger 412 is bent, is controlled largely by the thickness of support layer 400. It is accordingly easy to achieve very close control of this height. In the bending process, the region of each finger 412 adjacent the tip 414 thereof desirably becomes at least partially embedded in buffer layer 422.

Following the bending process, an encapsulant 432 such as a curable elastomer is applied to the side of dielectric layer 402 remote from support layer 400 and buffer layer 422. The encapsulant extends through the openings in dielectric layer 402 and into the holes 406 of the support layer. The encapsulant thus forms columns of encapsulant extending through the holes in the dielectric layer and surrounding the bent fingers 412. However, because the tip region of each such finger is engaged with buffer layer 422, the encapsulant does not entirely surround the tip regions 414 of the fingers. The encapsulant may be applied by silk screening, stenciling or other conventional liquid application processes. After the encapsulant is cured to the desired solid form, buffer layer 422 and support layer 400 are removed, as by dissolving them. This leaves the assembly in the condition shown, with the tip region 414 of each finger forming an exposed contact 349 at the tip of each column.

Figure 11:
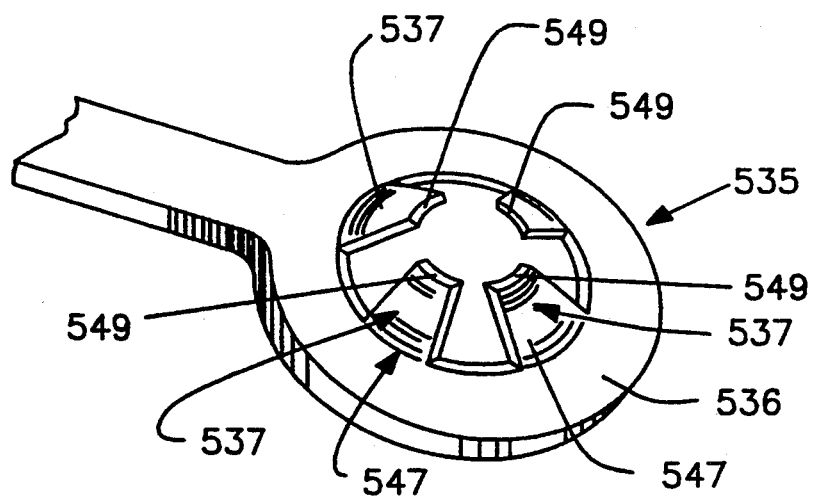
FIG. 11 is a fragmentary, perspective view depicting one portion of a part in accordance with further embodiment of the invention.
Figure 12:
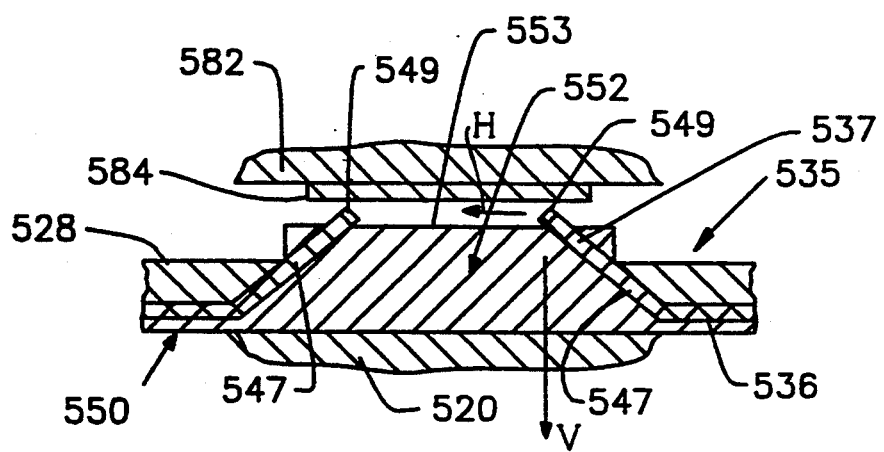
FIG. 12 is a diagrammatic, sectional view depicting the portions shown in FIG. 11 in conjunction with other elements.

A component according to a further embodiment of the invention has leads with terminal ends 535, one such terminal end being depicted in FIGS. 11 and 12. Each such terminal end includes a structural element in the form of a loop 536 and a plurality of projection sections 537. Each projection section has a bottom or base end 547 connected to loop 536 and a tip 549 remote from the loop. The tips of the projection sections extend inwardly from the loop towards one another, and also extend upwardly, above the plane of the loop. Thus, in this arrangement as well, the projection sections extend in oblique directions, with both vertical and horizontal components. The connection component according to this embodiment of the invention further includes a dielectric layer 528 and a layer of deformable encapsulant 550 having integrally formed columns 552 extending upwardly through holes in dielectric layer 528. Each such column has a top end 553 projecting upwardly above the dielectric layer 528. The terminal end 535 of each lead is aligned with one such hole and encapsulant column, so that the projection sections of the lead protrude upwardly through the encapsulant column, and so that the tips 549 of all of the projection sections are exposed at the top end of the encapsulant column. Each lead extends to a contact end (not shown) remote from the terminal end of the lead. In this and other respects, the component of FIGS. 11 and 12 is similar to the component discussed above with reference to FIGS. 8 and 9.

The component of FIGS. 11 and 12 is also used with a semiconductor chip 520 and substrate 582. Again, the leads of the connection component are connected to the contacts of chip 520 (not shown) and the subassembly including the chip and the connection component is engaged with the substrate. In the engaged condition, the tips of the projection sections bear on the contact pads 584 of the substrate, the projection sections being deformed and engaging the contact pads under the influence of their own resilience. Here, however, each contact pad 584 is engaged by a plurality of projection sections 537. This provides a redundant connection between each lead of the connection component and the associated contact pad of the substrate, so that imperfect engagement of any one projection section will not disrupt the connection. Moreover, the loop sections 536 of the leads reinforce the projection sections. As the projection sections engage the contact pads of the substrate, the forces transmitted through the projection sections tend to displace the base end 547 of each projection section outwardly, away from the center of the loop and downwardly. The outwardly-directed forces applied to the loop through projection sections on opposite sides of the loop tend to cancel one another. The downwardly-directed forces are distributed by the loop over a relatively large area of the underlying layers.

In this arrangement as well, as the tip 549 of each projection section 537 is forced downwardly in the vertical direction indicated by arrow V (FIG. 12) bending of the projection section 537 and pivoting of the projection section 537 about its base end 547 cause displacement of the tip 549 in the horizontal direction, indicated by arrow H towards the center of the loop. This horizontal movement of the tips during their engagement with the contact pads 584 of the substrate causes the tips to wipe the contact pads, thereby promoting effective electrical contact.

Although the drawing figures in this disclosure depict only one lead or only a few leads, it should be understood that connection components and assemblies according to the present invention normally incorporate many leads, the number of leads typically being equal to or greater than the number of contacts on the chip to be mounted. Although the chips depicted above have contacts in rows along the periphery of the chip, the present invention can also be employed with chips having contacts distributed over the entire chip surface in an area array pattern, or with any other arrangement of chip contacts, The arrangement of the contact ends of the leads on the connection component is altered to match the layout of the contacts on the chip. Also, the measures disclosed in our aforementioned International Application PCT/US 91/06920 (Publication No. WO 92/05582) for supporting the contact ends of the leads and for bonding the same to chip contacts may be employed in connection components according to the present invention. The disclosure of said International Application is hereby incorporated by reference herein. Merely by way of example, the International Application discloses interposers or dielectric structures having securement elements defining openings and leads having contact sections extending across such openings. The contact end of each lead is supported on both sides of the opening so that the same can be readily positioned for bonding to the chip contact. Also, the contact ends of the leads may include deformable and/or frangible structures as described in copending, commonly assigned U.S. patent application Ser. No. 07/919,772 filed Feb. 16, 1993, the disclosure of which is hereby also incorporated by reference herein.

Numerous other variations and combinations of the features discussed above may be employed within the broad compass of the present invention. For example, the dielectric top layers 328 and 528 may be omitted from the connection components of FIGS. 8, 9, 11 and 12. The fabrication process discussed with reference to FIGS. 10A–10G may be modified accordingly. Thus, if the dielectric layer is omitted, it may be desirable to fill the holes 406 in support layer 400 with a temporary masking material before the step of etching terminal metal layer 404 to forming the fingers 412.

The non-current carrying spring structures illustrated in FIGS. 6 and 7, and the spring-like lead sections depicted in FIGS. 8, 9, 11 and 12 all involve cantilever beam springs. However, other forms of springs may be used. Merely by way of example, the leads or springs may include leaf, volute, coil or other known spring forms.

As discussed above, the reinforcement element used to restrain an elastomeric element such as an elastomeric sheet against creep may include a sheet-like reinforcing element such as the reinforcing elements 46, 46' and 46" discussed above with reference to FIGS. 1–4. However, an elastomeric element may also be restrained against creep in other ways. For example, flexible but substantially inextensible fibers may be embedded within the elastomeric layer. Alternatively, the elastomeric layer may be confined around its periphery, as by providing a substantially inextensible ring extending between the interposer and the surface of the chip at the periphery of the interposer. Such a ring can confine the elastomeric material and prevent outward flow or creep the elastomeric material during service. As a further alternative, an elastomeric material may be confined between layers in much the same manner as the fluid discussed above with reference to FIG. 5. That is, the elastomeric material may be confined within a completely or partially sealed chamber defined between a pair of layers in the connection component itself. Such constraint will also prevent outward flow or displacement of the elastomeric material during service. Conversely, elastomeric materials can be utilized in forms other than continuous or semi-continuous layers. Thus, the resilient element of the assembly may include numerous elastomeric bodies, each aligned with one terminal of the connection component. Each such individual element may be provided with appropriate means for restraining it against creep during service.

As these and other variations and combinations of the features discussed above can be utilized without departing from the present invention as defined by the claims, the foregoing description of the preferred embodiments should be taken by way of illustration rather than by way of limitation of the invention set forth in the claims.

What is claimed is:

1. A semiconductor chip assembly comprising:
   (a) a semiconductor chip having surfaces and a plurality of contacts;
   (b) a plurality of terminals formed separately from said chip and overlying a first surface of said chip;
   (c) flexible leads electrically interconnecting said contacts on said chip and said terminals so that said terminals are movable towards and away from said first surface of said chip, said leads being permanently connected to said contacts and said terminals;
   (d) force means for biasing said terminals away from said first surface of said chip;
   (e) a substrate having a top surface and a plurality of contact pads on said top surface; and
   (f) means for permanently holding said chip and said substrate together so that said first surface of said chip faces toward said substrate and so that said terminals are disposed between said chip and said substrate and said terminals engage said contact pads under the influence of said force means.

2. An assembly as claimed in claim 1, wherein said substrate has one or more additional electrical components mounted thereon and electrically connected to said contact pads, whereby said additional electrical components are electrically interconnected with said chip by way of said contact pads, terminals, leads and contacts.

3. An assembly as claimed in claim 2, wherein said additional electrical components include one or more additional semiconductor chips.

4. An assembly as claimed in claim 1, wherein said terminals are not bonded to said contact pads on said substrate.

5. An assembly as claimed in claim 1, further comprising a flexible sheetlike dielectric interposer overlying said chip, said interposer having a first surface facing toward said chip and a second surface facing away from said chip, said terminals being mounted on said second surface of said interposer.

6. An assembly as claimed in claim 5, wherein said force means includes at least one resilient element disposed between said first surface of said interposer and said first surface of said chip.

7. An assembly as claimed in claim 6, wherein said at least one resilient element includes at least one metallic spring.

8. An assembly as claimed in claim 7, wherein said at least one metallic spring includes a plurality of independently deformable metallic spring elements, each said metallic spring element bearing on said first surface of said interposer in alignment with one of said terminals on said second surface of said interposer.

9. An assembly as claimed in claim 8, wherein said at least one metallic spring element includes a metallic sheet overlying at least a part of said first surface of said chip, a plurality of said spring elements being formed integrally with said sheet and projecting upwardly therefrom towards said first surface of said interposer.

10. An assembly as claimed in claim 9, wherein each said spring element has a first end connected to said metallic sheet and a second end remote from said metallic sheet bearing on said interposer.

11. An assembly as claimed in claim 6, wherein said resilient means includes at least one elastomeric element disposed between said first surface of said interposer and said first surface of said chip and means for restraining said at least one elastomeric element against creep.

12. An assembly as claimed in claim 11, wherein said at least one elastomeric element includes a sheet of an elastomeric material disposed between said first surface of said interposer and said chip.

13. An assembly as claimed in claim 12 wherein said means for restraining includes one or more flexible reinforcement elements mechanically engaged with said elastomeric sheet, each said flexible reinforcement element being formed from a material having creep resistance substantially higher than the creep resistance of said elastomeric material, each said reinforcement element extending in a horizontal direction, substantially parallel to said first surface of said chip and said first surface of said interposer.

14. An assembly as claimed in claim 13, wherein each said reinforcement element is metallic.

15. An assembly as claimed in claim 13, wherein said one or more reinforcement elements includes a reinforcing sheet formed from said high creep resistance material.

16. An assembly as claimed in claim 15, wherein said reinforcing sheet has holes therein, said holes being aligned with said terminals.

17. An assembly as claimed in claim 13, wherein said at least one reinforcing element is embedded in said elastomeric sheet.

18. An assembly as claimed in claim 13, wherein said at least one reinforcing element is interposed between said elastomeric sheet and said first surface of said interposer.

19. An assembly as claimed in claim 12, wherein said interposer includes a sheet of a polymeric material, and wherein said means for restraining includes at least one interposer reinforcing element embedded in said polymeric sheet, each said interposer reinforcing element being formed from a reinforcement material having greater creep resistance than said polymeric material.

20. An assembly as claimed in claim 19, wherein said at least one interposer reinforcing element includes a metallic sheet bonded to said polymeric sheet.

21. An assembly as claimed in claim 20, wherein said metallic sheet has holes aligned with said terminals.

22. An assembly as claimed in claim 5, wherein said force means includes means for containing a fluid between said first surface of said interposer and said first surface of said chip, and wherein said means for holding includes means for biasing said chip towards said substrate, so as to place said fluid contained between said interposer and said chip under a compressive load.

23. An assembly as claimed in claim 22, wherein said means for containing includes said interposer, said fluid being in contact with said first surface of said interposer.

24. An assembly as claimed in claim 22, wherein said fluid is substantially incompressible.

25. An assembly as claimed in claim 22, wherein said fluid is a visco-elastic material.

26. An assembly as claimed in claim 1, wherein said flexible leads are resilient, and wherein said force means includes said flexible leads.

27. An assembly as claimed in claim 26, further comprising a dielectric cover layer overlying said chip and disposed between said first surface of said chip and said top surface of said substrate, said cover layer having holes therein, each said flexible lead including a first portion extending between said cover layer and said chip and a second portion protruding through one of said holes in said cover layer.

28. An assembly as claimed in claim 27, further comprising a polymeric encapsulant surrounding at least a portion of each said flexible lead.

29. An assembly as claimed in claim 28, wherein said encapsulant includes columns of encapsulant extending through said holes, in a vertical direction away from said chip, each said column terminating in a tip remote from said chip, each said terminal being disposed on the tip of one said column, each said flexible lead extending within one of said columns to the associated terminal.

30. A semiconductor chip connection component comprising:
 (a) a flexible sheet like dielectric interposer having oppositely-facing first and second surfaces;
 (b) a plurality of terminals mounted on said second surface of said interposer and supported by said interposer;
 (c) at least one elastomeric element mounted to said first surface of said interposer in alignment with said terminals on said second surface, said flexible interposer permitting displacement of said terminals towards said elastomeric element, said elastomeric element being compressed upon such displacement; and
 (d) means for restraining said at least one elastomeric element against creep.

31. A component as claimed in claim 30, wherein said at least one elastomeric element includes a sheet of an elastomeric material confronting said first surface of said interposer .

32. A component as claimed in claim 31 wherein said means for restraining includes one or more flexible reinforcement elements mechanically engaged with said elastomeric sheet, each said flexible reinforcement element being formed from a material having creep resistance substantially higher than the creep resistance of said elastomeric material, each said reinforcement element extending in a horizontal direction, substantially parallel to said first surface of said interposer.

33. A component as claimed in claim 32, wherein each said reinforcement element is metallic.

34. A component as claimed in claim 32, wherein said one or more reinforcement elements includes a reinforcing sheet formed from said high creep resistance material.

35. A component as claimed in claim 34, wherein said reinforcing sheet has holes therein, said holes being aligned with said terminals.

36. A component as claimed in claim 32, wherein said at least one reinforcing element is embedded in said elastomeric sheet.

37. A component as claimed in claim 32, wherein said at least one reinforcing element is disposed between said elastomeric sheet and said first surface of said interposer.

38. A component as claimed in claim 31, wherein said interposer includes a sheet of a polymeric material, and wherein said means for restraining includes at least one interposer reinforcing element mechanically interengaged with said polymeric sheet, each said interposer reinforcing element being formed from a reinforcement material having greater creep resistance than said polymeric material.

39. A component as claimed in claim 38, wherein said at least one interposer reinforcing element includes a metallic sheet bonded to said polymeric sheet.

40. A component as claimed in claim 39, wherein said metallic sheet has holes aligned with said terminals.

41. A semiconductor chip connection component comprising:
   (a) a flexible sheetlike dielectric interposer having oppositely-facing first and second surfaces;
   (b) a plurality of terminals mounted on said second surface of said interposer at spaced-apart locations thereon; and
   (c) at least one metallic spring mounted to said first surface of said interposer, said at least one metallic spring including a plurality of independently deformable metallic spring elements, each said metallic spring element bearing on said first surface of said interposer in alignment with one of said terminals on said second surface of said interposer so that each said spring element will be deflected upon movement of the aligned terminal and flexure of the interposer.

42. A component as claimed in claim 41, further comprising a metallic sheet extending parallel to said first surface of said interposer, a plurality of said spring elements being formed integrally with said metallic sheet and projecting therefrom to said first surface of said interposer.

43. A component as claimed in claim 41, wherein each said spring element has a first end connected to said metallic sheet and a second end remote from said metallic sheet bearing on said interposer.

44. A semiconductor chip connection component comprising:
   (a) a sheetlike dielectric interposer having a central region, a peripheral region surrounding said central region, a downwardly facing first surface, an upwardly facing second surfaces, said interposer defining horizontal directions parallel to said surfaces;
   (b) a plurality of electrically conductive leads mounted to said interposer, each said lead having at least one resilient, vertically-extensive projection section extending upwardly from a bottom end to a top end and a terminal at the top end of each such projection section, each said lead also having a contact end electrically connected to said at least one projection section but spaced apart therefrom in a horizontal direction, said terminals and said projection sections being disposed on said central region of said interposer, said contact ends of said leads being disposed in said peripheral region of said interposer.

45. A semiconductor chip connection component comprising:
   (a) a dielectric interposer;
   (b) a plurality of electrically conductive leads mounted to said interposer, each said lead having at least one resilient, vertically-extensive projection section extending upwardly from a bottom end to a top end, the top end of each said projection section defining a terminal disposed above said interposer, each said lead also having a contact end electrically connected to said at least one projection section, and
   (c) a compliant encapsulant projecting upwardly from said interposer around said projection sections of said leads, the terminals at the top ends of said projection sections being exposed atop said encapsulant, whereby said encapsulant supports and positions said projection sections and said terminals.

46. A component as claimed in claim 45, wherein said encapsulant includes columns of encapsulant spaced apart from one another and extending upwardly from said interposer, each said column terminating in a tip remote from said interposer, each said terminal being disposed on the tip of one said column, each said projection section extending upwardly from said interposer within one of said columns.

47. A component as claimed in claim 46, wherein said interposer is sheetlike and has a downwardly-facing first surface and an upwardly-facing second surface, said encapsulant including a layer of encapsulant disposed beneath said interposer, said columns extending upwardly from said layer through said holes in said interposer.

48. A semiconductor chip connection component comprising:
   (a) a dielectric structure; and
   (b) a plurality of electrically conductive metallic leads, each said lead including a projection section having a bottom end supported on said dielectric structure and an upper end remote from said bottom end, each said projection section defining a tip at its upper end, each said projection section extending in an oblique direction, vertically and horizontally from its bottom end to its upper end, whereby upon engagement of the tip of the projection section with a contact pad, the tip will move horizontally and wipe the contact pad, each said lead also including a contact end electrically connected to the projection section of the lead, the contact end being adapted for connection to a semiconductor chip.

49. A component as claimed in claim 48 wherein each said lead includes a plurality of projection sections, the tips of the projection sections on each said lead being disposed adjacent one another so that such tips may be engaged with a common contact pad on a substrate.

50. A semiconductor chip connection component comprising:
   (a) a flexible sheetlike dielectric interposer having oppositely-facing first and second surfaces;
   (b) a plurality of terminals mounted on said second surface of said interposer at spaced-apart locations thereon; and
   (c) reservoir means for defining a fluid reservoir extending on said first surface of said interposer and retaining a fluid within said reservoir so that when said fluid is placed under pressure, the pressure on said fluid will be applied over the first surface of said interposer.

51. A component as claimed in claim 50, wherein said reservoir means includes said interposer and a flexible membrane extending generally parallel to said interposer and sealed thereto so that said membrane and said interposer cooperatively define a sealed chamber.

52. A component as claimed in claim 51, further comprising a substantially incompressible fluid disposed in said chamber.

53. A component as claimed in claim 51, wherein said fluid is a visco-elastic material.

* * * * *